(12) United States Patent
Banerji

(10) Patent No.: US 6,400,289 B1
(45) Date of Patent: Jun. 4, 2002

(54) SYSTEM AND METHOD FOR PERFORMING LOSSLESS DATA COMPRESSION AND DECOMPRESSION

(75) Inventor: Ashish Banerji, Gaithersburg, MD (US)

(73) Assignee: Hughes Electronics Corporation, El Segundo, CA (US)

( * ) Notice: Subject to any disclaimer, the term of this patent is extended or adjusted under 35 U.S.C. 154(b) by 1 day.

(21) Appl. No.: 09/712,618

(22) Filed: Nov. 14, 2000

Related U.S. Application Data

(60) Provisional application No. 60/185,971, filed on Mar. 1, 2000.

(51) Int. Cl.[7] ................................................. H03M 7/00
(52) U.S. Cl. ........................................................ 341/60
(58) Field of Search ........................... 341/51, 60, 107, 341/65; 382/247, 233, 244, 79; 395/612; 340/347

(56) References Cited

U.S. PATENT DOCUMENTS

| | | | | |
|---|---|---|---|---|
| 5,640,559 A | * | 6/1997 | Silberbauer et al. | ......... 395/612 |
| 5,724,357 A | * | 3/1998 | Derks | ......... 370/413 |
| 5,794,189 A | * | 8/1998 | Gould | ......... 704/231 |
| 5,809,176 A | * | 9/1998 | Yajima | ......... 382/247 |

* cited by examiner

Primary Examiner—Peguy Jeanpierre
Assistant Examiner—Joseph Lauture
(74) Attorney, Agent, or Firm—John T. Whelan; Michael W. Sales

(57) ABSTRACT

A system and method employing an improved data compression and decompression technique for use in a communication system Specifically, the system and method employs an improved YK algorithm which uses an appropriate form of the trie data structure for the parsing operation. With the use of this data structure, the parsing complexity using this data structure is essentially proportional to the data size, and hence is very fast. The improved YK algorithm also is capable of handling errors in data without getting into an ambiguous state or causing the hardware or software system to crash. Furthermore, the improved YK algorithm is also capable of parsing the data based on predefined frequency characteristics and predefined grammar. The improved YK algorithm also sequentially updates the grammar, while keeping the number of variables below a pre-defined limit. This changes the grammar gradually, and can potentially increase the compression efficiency. The system and method are also capable of performing the above operations for data compression and decompression of packetized data based on the nature in which the data is packetized, that is, whether the data packets have forced or natural boundaries.

38 Claims, 3 Drawing Sheets

SYSTEM AND METHOD FOR PERFORMING LOSSLESS DATA COMPRESSION AND DECOMPRESSION

The present invention claims benefit under 35 U.S.C. §119(e) of a U.S. provisional application of Ashish Banerji entitled "A Set of Improved Techniques for Implementing the YK Lossless Data Compression Algorithm", Ser. No. 60/185,971, filed Mar. 1, 2000, the entire contents of which is incorporated herein by reference.

CROSS-REFERENCE TO RELATED APPLICATION

Related subject matter is disclosed in U.S. patent application Ser. No. 09/711,703, filed concurrently herewith, of En-Hui Yang for "Lossless Data Compression Using Greedy Sequential Grammar Transform", the entire contents of which is incorporated herein by reference.

BACKGROUND OF THE INVENTION

1. Field of the Invention

The present invention relates to an improved system and method for performing lossless data compression and decompression. More particularly, the present invention relates to a system and method for performing lossless data compression and decompression which employs a trie-type data structure to efficiently parse the data string being compressed, while also taking into account any pre-defined grammar and pre-defined source statistics relating to the data in the data string, as well as error handling at the decoder and memory constraints for both the encoder and decoder.

2. Description of the Related Art

Lossless data compression algorithms can be broadly classified into two types, namely, dictionary coding and statistical coding. The most widely used dictionary coding algorithms are the Lempel-Ziv algorithms and their variants. Dictionary coding techniques achieve compression by exploiting redundancy in data through some kind of string matching mechanism. In contrast, statistical coding methods such as arithmetic coding exploit the redundancy in data through a statistical model. Very recently, a new type of lossless source code called a grammar-based code was proposed in a publication by J. C. Kieffer and E. -H. Yang entitled "Grammar Based Codes: A New Class of Universal Lossless Source Codes," IEEE Transactions on Information Theory, the entire contents of which is incorporated herein by reference.

The class of grammar-based codes is broad enough to include Lempel-Ziv types of codes as special cases. To compress a data sequence, a grammar-based code first transforms the data sequence into a context-free grammar, from which the original data sequence can be fully reconstructed by performing parallel substitutions. This context-free grammar, which is a compact representation of original data, is compressed using arithmetic encoding. It has been proved in the Kieffer publication referenced above that if a grammar-based code transforms each data sequence into an irreducible context-free grammar, then the grammar-based code is universal for the class of stationary, ergodic sources. Grammar-based codes offer a design framework in which arithmetic coding and string matching capability can be combined in an elegant manner.

Within the framework of grammar-based codes, an efficient greedy grammar transform was developed as described in a publication by E. -H. Yang and J. C. Kieffer, entitled "Efficient Universal Lossless Data Compression Algorithms Based on a Greedy Sequential Grammar Transform—Part one: Without Context Models", IEEE Transactions on Information Theory, the entire contents of which is incorporated by reference herein. This greedy grammar transform sequentially constructs a sequence of irreducible context-free grammars from which the original data sequence can be recovered incrementally. The greedy grammar transform sequentially parses the original data into non-overlapping, variable-length phrases, and updates the grammar accordingly.

Based on this greedy grammar transform, three universal lossless data compression algorithms are proposed in the Yang publication cited above, namely, a hierarchical algorithm a sequential algorithm, and an improved sequential algorithm These algorithms jointly optimize, in some sense, string matching and arithmetic coding capability. Although the three algorithms are based on the same grammar transform, they differ in their encoding strategies.

The hierarchical algorithm encodes the final irreducible grammar using a zero order arithmetic code with a dynamic alphabet, while the two sequential algorithms use arithmetic coding to encode the sequence of parsed phrases, instead of the final grammar. The improved sequential algorithm is an improved version of the sequential algorithm that better exploits the structure of the grammar at each step. The improved sequential algorithm, henceforth referred to as the YK algorithm, is of particular interest, since experimental results using this algorithm have yielded superior compression performance compared to the other two algorithms. In addition, unlike the hierarchical algorithm this algorithm is sequential and does not require the whole data to be present before starting the encoding operation. This algorithm has been proved to be universal in the sense that it can asymptotically achieve the entropy rate of any stationary, ergodic source. In addition, the algorithm has been shown to have linear time complexity with data size.

Experimental results using the YK algorithm have shown that the YK algorithm effectively compresses files of sizes ranging from small, such as internet datagrams to big files, such as those occurring in archiving applications. The YK algorithm significantly outperforms Lempel-Ziv type algorithms such as Gzip for both small and large file sizes. In addition, the YK algorithm is more effective than the Burrows-Wheeler transform based algorithm BZIP2, particularly for small files.

The basic data structure used by the YK algorithm is a context-free grammar, whose components are a source alphabet, a set of variables, and production rules that map each variable into a finite string composed of source symbols and variables. A grammar based compression algorithm transforms the original data into such a grammar, with the additional requirement that the grammar be irreducible. A grammar is irreducible if it satisfies a certain definition of compactness. There are several ways to construct an irreducible grammar that represents the original data. The YK algorithm is based on one such grammar transform that sequentially constructs a sequence of irreducible grammars in a greedy manner.

At an intermediate stage of the YK algorithm, there exists an irreducible grammar, defined by the source alphabet, the current set of variables, and the corresponding production rules. Also, there exists a frequency distribution on the source alphabet and the variables. The basic implementation of the YK encoding algorithm consists of a sequentially iterative application of three fundamental steps, namely, parsing, updating and encoding. The parsing operation determines the longest prefix of the remaining part of the original data string that is represented by one of the current variables. The updating operation subsequently updates the grammar after adding the new parsed substring, and modifies the frequency distribution of the source alphabet and/or the variables. The encoding operation uses the frequency distribution on the symbols and arithmetic encoding to code the parsed substring. The decoder sequentially uses arithmetic decoding to determine the parsed substring, followed by updating, to produce an identical sequence of grammars as in the encoder, from which the original data is recovered incrementally.

The following is a theoretical description of the YK algorithm. In defining the variables used in the following description, let A be the source alphabet with cardinality $|A|$ greater than or equal to 2, let $A^+$ denote the set of all finite strings drawn from A, let $x = x_1 x_2 \ldots x_n$ be a finite string drawn for the alphabet A that is to be compressed, and let $S = \{s_0, s_1, s_2, \ldots\}$ be a countable set, disjoint from A. For $j \geq 1$, let $S(j) = \{s_0, s_1, \ldots s_{j-1}\}$ and $S(j)^+ = \{s_1, s_2, \ldots s_{j-1}\}$. A context-free grammar G is a mapping from $S(j)$ to $S(j) \cup A)^+$ for some $j \geq 1$. The mapping G is explicitly represented by writing each relationship $(s_i, G(s_i))$ as $s_i \rightarrow G(s_i)$, for $i < j$. $G(s)$ is called as the production rule for s. The symbol $s_o$ is special in the sense that the A-string represented by $s_o$ is the original data string. $s_o$ is referred to as the start symbol, while $s_i$ for $i < 1$ are called variables. An example of a grammar is shown below:

$s_0 \rightarrow s_3 s_1 s_1 b b s_2 b s_4 s_4 c$ $s_1 \rightarrow s_2 a$ $s_2 \rightarrow ac$ $s_3 \rightarrow ab$ $s_4 \rightarrow s_3 s_2 c$ This is an example of an irreducible grammar representing the data sequence abacaacabbacbabaccabaccc. This is a simplified example where $A = \{a, b, c\}$. In a conventional data compression system, A can contain up to 256 ASCII characters.

This grammar is an example of an admissible grammar because one obtains a sequence from A after finitely many parallel replacements of variables in $G(s_i)$, and every variable $s_i(i < j)$ is replaced at least once by $G(s_i)$. The resulting sequence from A is called A-string represented by the respective variable. As stated above, the symbol $s_o$ is special in the sense that the A-string represented by $s_o$ is the original data string. In addition, this grammar is an irreducible grammar because none of Reduction Rules 1 to 5 in the Yang publication cited above can be applied to it to get a new admissible grammar. Details of the concepts of admissible grammar and irreducible grammar can be found in the Yang publication.

The Yang publication referenced above, as well as a publication by E. H. Yang entitled "Efficient Universal Lossless Data Compression Algorithms Based on a Greedy Sequential Grammar Transform: Implementation and Experimental Results", Technical Report released to the Hughes Network Systems, Mar. 31, 1999, the entire content of which is incorporated by reference herein, describe the working of the YK algorithm and its basic implementation in detail. The main steps of the algorithm are briefly summarized below, with $x = x_1 x_2 \ldots x_n$ being a sequence from A, that is to be compressed. The YK algorithm proceeds through the following steps:

Parsing: The parsing operation parses the sequence x sequentially into non-overlapping substrings $\{x_1, x_2 \ldots x_{n_1}, \ldots, x_{n_{i-1}+1} \ldots x_{n_i}\}$, where $1 \geq i \geq t$, $n_1 = 1$, and $n_t = n$. The first substring is $x_1$. At the $i^{th}$ step, suppose that the first i phrases $x_1, x_2 \ldots x_{n_1}, \ldots, x_{n_{i-1}+1} \ldots x_{n_i}$ have been parsed off. Suppose the variable set of the current grammar $G_i$ is $s(j_i) = \{s_0, s_1, \ldots s_{j_i-1}\}$, with $j_1 = 1$. The next substring $x_{n_i+1} \ldots x_{n_{i+1}}$ is the longest prefix of $x_{n_i+1} \ldots x_n$ that can be represented by $s_j$ if such a prefix exists in $s(j_i)$. If such a prefix exists, the next parsed phrase is $s_j$; otherwise, the next parsed phrase is the symbol $x_{n_i+1}$.

Grammar Update: Let $\alpha$ denote the last symbol on the right end of $G_i(s_0)$. The parsed phrase (denoted by $\beta$) is appended to the right end of $G_i(s_0)$ to give the appended grammar $G_{i'}$. The appended grammar is reduced, if possible, using Reduction Rules (the Yang publication) to yield an irreducible grammar $G_{i+1}$. Define the indicator sequence I: $\{1, 2, \ldots, t\} \rightarrow \{0, 1\}$ as follows: $I(1) = 0$, and for any $i > 1$, $I(i)$ is equal to 0 if $G_{i+1}$ equals $G_{i'}$ (i.e. reduction was not possible), and 1 otherwise (i.e. reduction was possible). It is proved in the first Yang publication referenced above that the grammar $G_{i'}$ is reducible if and only if $\alpha\beta$ is the only non-overlapping repeated pattern of length $\geq 2$ in $G_{i'}$. To determine if the appended grammar is reducible, a list $L_1(\gamma)$ is maintained for all symbols in $A \cup S(j_i)$, where $L_1(\gamma)$ consists of triples $(\eta, m, n)$, where $\eta \in A \cup S(j_i)$, and m and n are row and column locations in the grammar $G_i$ of the pattern $\gamma\eta$, which can potentially be repeated in future appended grammars. If $\eta$ is the first component of $L_1(\gamma)$, then $\eta$ is said to be in the list $L_1(\gamma)$. Depending on the values of $I(i+1)$ and $I(i)$, there are three possible distinct cases:

Case 0: $I(i+1) = 0$

Case 10: $I(i+1) = 1$, $I(i) = 0$

Case 11: $I(i+1) = 1$, $I(i) = 1$

Under Case 0, $G_{i+1}$ is equal to $G_{i'}$. Under Case 10, $G_{i+1}$ is obtained by adding a new row to $G_i$ representing the repeated phrase $\alpha\beta$. Under Case 11, $G_{i+1}$ is obtained by adding $\beta$ to the end of the row corresponding to the last new variable. The lists $L_1(\gamma)$ are appropriately modified in each of the three cases. The details of the grammar and list update operations can be found in the first Yang publication referenced above.

Arithmetic Encoding: An order 1 arithmetic code is used to encode the sequence $\{I(i)\}_{i=1}^t$, and the parsed phrases $\beta$ are encoded using an order 0 arithmetic encoder in an interleaved manner. The alphabet used for the order 1 arithmetic encoder is $\{0,1\}$, and the counters $c(0,0)$, $c(0,1)$, $c(1,0)$, and $c(1,1)$ are used for the order 1 frequency distribution on the alphabet. Also, for each $\gamma \in S \cup A$, two sets of counters $c(\gamma)$ and $\hat{c}(\gamma)$ are used to model the frequency distribution for coding the parsed phrases $\beta$. Depending on the three cases, the coding of $\beta$ uses the following alphabets and counters:

Case 0: The alphabet used for coding $\beta$ is $A \cup S(j_i) \cup \{\phi\} - L_2(\alpha)$, where $L_2(\alpha)$ is a list related to the list $L_1(\alpha)$. $L_2(\alpha)$ is defined as $L_1(\alpha) \cup \cdot$ where $\cdot$ includes all those $\eta$ such that there exists a variable whose production rule is $\cdot \eta$, and $\phi$ is the end-of-sequence symbol disjoint from A and $s(j_i)$. (See the first Yang publication for the precise definitions of $L_1(\cdot)$ and $L_2(\cdot)$). The counters $c(\gamma)$ are used for the frequency distribution.

Case 10: The alphabet used for coding $\beta$ is the list $L_1(\alpha)$. The counters $\hat{c}(\gamma)$ are used for frequency distribution.

Case 11: The parsed phrase $\beta$ is the only element in the list $L_1(\alpha)$, and hence is not coded.

When the YK encoder reaches the end of the file being compressed, it encodes the indicator 0(corresponding to case 0), and subsequently encodes the end-of-sequence symbol $\phi$. The counters are initialized at the start of the YK algorithm, and are updated suitably in each of the three cases. At initialization, the counters c(r, s) equal 1 for r, s=0,1, while the counters c(γ) and ĉ(γ) are given the value 1 for γ∈A, and 0 otherwise. The details of the arithmetic coding can be found in the first Yang publication referenced above. The details of arithmetic coding can be found in a publication by I. H. Witten, R. Neal, and J. G. Cleary entitled "Arithmetic Coding for Data Compression," *Communications of the ACM*, Vol. 30, pp. 520–540, 1987, the entire content of which is incorporated by reference herein. Also, to overcome the problem of dealing with potentially large alphabet in Case 0, the arithmetic coding in this case can be efficiently performed using a recently proposed technique called multilevel arithmetic coding, as described in a publication by E. H. Yang and Y. Jia, "Universal Lossless Coding of Sources with Large or Unbounded Alphabets,", Dept. of Electrical and Computer Engineering, University of Waterloo, 1999, the entire content of which is incorporated by reference herein.

The YK decoder essentially decodes the sequence $I(i)_{i=1}^{t}$ using an order 1 arithmetic decoder, and based on one of the three cases discussed above, decodes the parsed phrase β. Then it updates the grammar, the lists, and the counters in exactly the same manner as in the YK encoder. The decoder stops when it decodes the indicator 0, followed by the end-of-sequence symbol φ. However, the YK decoder does not perform the parsing operation.

As discussed above, parsing is one of the three main operations in the YK encoder. However, if the parsing operation is not performed efficiently, it would consume a significant portion of the overall time taken by the encoder, and make the YK algorithm slow. Also, if the parsing operation is inefficient, there would be a significant time gap between the operations of the encoder and the decoder, since there is no parsing operation in the decoder. This is crucial in real time applications, since it is appropriate for the encoder and decoder to work at substantially similar speeds in order to avoid substantial overflow or underflow of their buffers. The parsing operation in the second Yang publication may be slow because the search for the next parsed phrase is performed by individually checking a group of many variables.

In addition, the compressed bit-stream from the YK encoder can be subjected to bit-errors during transmission. A naïve YK decoder can possibly get into an inconsistent mode of operation where there are bit errors in the compressed bit stream, which is inevitable in certain applications. In unreliable systems, the decoder has to operate on a possibly erroneous bit-stream As a result, the decoder can get into a situation that can put it in an ambiguous state, and cause the software or hardware devices to crash. For instance, the decoder can get into a non-terminating loop of operation, producing a potentially unbounded decompressed data. Another example would be for the decoder to decode an erroneous symbol that would lead to a conflicting state while updating its existing grammar.

As can also be appreciated from the above description of the YK algorithm, the memory requirement of the YK algorithm grows with data size. For certain applications, the memory requirement can go beyond what the system can afford. It is imperative in such situations to have a compression algorithm that can continue to work without exceeding a pre-defined limit on the memory requirement. The two extreme ways known as freezing and restarting are possible solutions, but they often lead to poor compression efficiency.

In addition, the basic YK algorithm starts with a flat frequency distribution on the symbols, and adaptively updates the frequency counts as the algorithm proceeds. However, starting with a flat frequency distribution is inefficient, especially when a file having a small size is being compressed and decompressed. Furthermore, the basic YK algorithm starts with a null grammar, and builds the whole grammar from scratch. However, starting with a null grammar is inefficient, especially when a small file is being compressed and decompressed as the benefits of having a grammar are never really realized compressing and decompressing small files.

A need therefore exists for an improved data compression and decompression system and method which eliminates the deficiencies discussed above.

SUMMARY OF THE INVENTION

It is therefore an object of the present invention to provide a system and method employing an improved lossless compression algorithm that overcomes the above deficiencies.

It is also an object of the present invention to provide a system and method employing a YK compression algorithm that uses a trie type data structure that can easily be computer implemented which provides faster parsing in data compression.

It is yet another object of the present invention to provide a system and method employing a decoder that can handle bit-errors entering the decoder without causing the system to crash or enter an infinite loop.

It is a further object of the present invention to provide a system and method which constrains the sizes of grammar, lists, and parsing tries used when compressing a large file so that the constraint mechanisms do not lead to poor compression efficiencies.

It is another object of the present invention to provide a system and method which starts a compression of a file with a pre-defined frequency distribution at both the encoder and the decoder in order to improve compression efficiency.

It is yet another object of the present invention to provide a system and method that starts a YK compression of a file with a pre-defined grammar built using typical training data set at both the encoder and the decoder.

It is yet another object of the present invention to provide a system and method that performs YK compression of incoming data packets and produces outgoing compressed data packets in such a way that each outgoing data packet has sufficient information to recreate the corresponding input data packet without knowledge of future compressed data packets.

These and other objects of the present invention are substantially achieved by providing system and method employing an improved data compression and decompression technique for use in a communication system. Specifically, the system and method employs an improved YK algorithm which uses an appropriate form of the trie data structure for the parsing operation. With the use of this data structure, the parsing complexity using this data structure is essentially proportional to the data size, and hence is very fast. The improved YK algorithm also is capable of handling errors in data without getting into an ambiguous state or causing the hardware or software system to crash. The improved YK algorithm also sequentially updates the grammar, while keeping the number of variables below a pre-defined limit. This changes the grammar gradually, and can potentially increase the compression efficiency.

The system and method are capable of parsing an input string into irreducible grammar by using a trie-type data structure that represents the variables of the irreducible grammar, updating the grammar based on the last character to he parsed in the input string, and arithmetically encoding the irreducible grammar into a stream of bits to be sent to a decoder. The trie-type data structure comprises a root and a plurality of nodes, and traversal of the trie-type data structure from the root to one of said plurality of the nodes achieves a representation of variables of the grammar.

The system and method further are capable of decompressing an input bit stream at a decoding system The system and method arithmetically decode the input bit stream based on irreducible grammar, and update the grammar based on the last character in the input bit stream. The decoding and updating steps are performed in such a way to substantially prevent bit-errors from affecting operation of the decoding system.

The system and method also operate to parse an input string into irreducible grammar, update the grammar based on the last character to be parsed in the input string, and arithmetically encode the irreducible grammar into a string of bits to be sent to a decoder. The system and method repeats the parsing, updating and arithmetically encoding steps until a number of variables for said grammar reaches a predetermined limit, and then reusing a previous variable by deleting the previous variable from the grammar and creating a new variable that is defined by additional input data than the previous variable, to prevent said grammar from exceeding a predetermined limit of memory. The system and method further begin with a predefined frequency count distribution of a source alphabet, or a predefined grammar, and then operate to parse the input string based on the predefined frequency count distribution or predefined grammar, while also updated the frequency count distribution or predefined grammar based on the last character to be parsed in the input bit stream.

Furthermore, the system and method can operate to compress or decompress a data bit stream configured in the form of data packets. Specifically, during compression, the system and method parse the bits in each of the data packets into irreducible grammar based on a trie-type data structure that represents the variables of the irreducible grammar. The system and method perform the parsing of data in each respective data packet without using knowledge of the data bits in the subsequent data packets, and also update the grammar based on the parsed characters in the respective data packets without using knowledge of the data bits in the subsequent data packets. During decompression, the system and method decompress the data packets based on irreducible grammar in a trie-type data structure that represents the variables of the irreducible grammar. The system and method perform the decompressing of data in each respective data packet without using knowledge of the data bits in the subsequently received data packets, and also update the grammar based in the respective data packets without using knowledge of the data bits in the subsequently received data packets.

BRIEF DESCRIPTION OF THE DRAWINGS

These and other objects, advantages and novel features of the invention will be more readily appreciated from the following detailed description when read in conjunction with the accompanying drawings, in which.

DETAILED DESCRIPTION OF THE PREFERRED EMBODIMENTS

Figure 1:
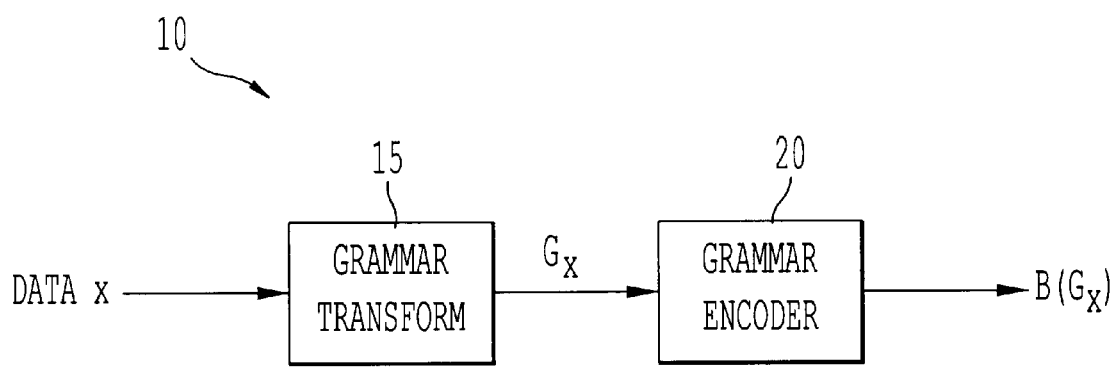
FIG. 1 illustrates a block diagram of an example of a system for performing data compression using an improved YK algorithm according to an embodiment of the present invention.

FIG. 1 is a block diagram illustrating an example of a data compressor 10 which performs data compression using an improved YK algorithm according to an embodiment of the present invention. As shown, data compressor 10 comprises a grammar transform 15 and a grammar encoder 20. Data x is input into grammar transform 15. Data x represents a string of input characters. Each character can be, for example, any one of a set of 256 ASCII characters.

Grammar transform 15 transforms the uncompressed input data into a string comprised of both variables and characters. Grammar transform 15 is a repetitive process in that the process is repeated again and again as more input data x reaches the grammar transform 15. Each variable represents a particular combination of input data ASCII characters and other variables. This string of characters and variables mixed is called grammar. Grammar encoder 20 performs statistical processing to transform the grammar comprised of input characters and variables into a series of bits that represent a compressed representation of data x. These compressed bits are then transmitted for receipt by a decoder. As described in more detail below, the YK compression algorithm is a two step process where ASCII characters are first transformed into a grammar made up of variables and ASCII characters and then, the grammar is encoded into a string of bits that represent the compressed version of the input data.

Figure 2:
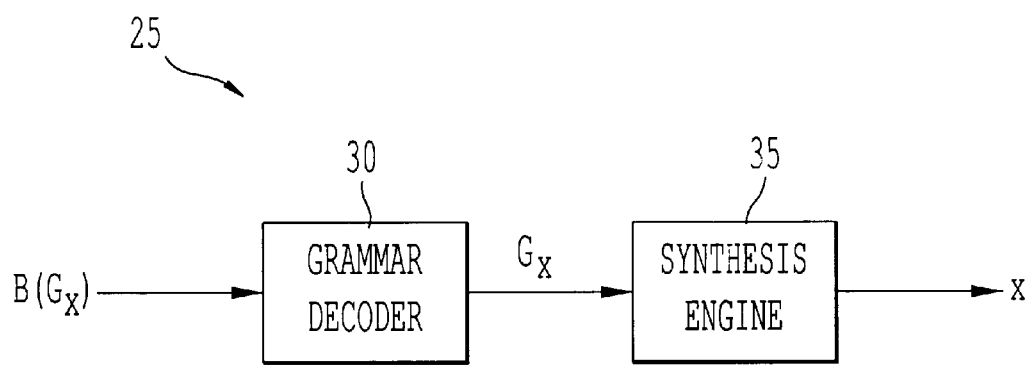
FIG. 2 illustrates a block diagram of an example of a system for performing data decompression using an improved YK algorithm according to an embodiment of the present invention.

FIG. 2 illustrates an example of a data decompressor 25 employing an improved YK algorithm according to an embodiment of the present invention. Data decompressor 25 comprises grammar decoder 30 and synthesis engine 35. A series of bits, that represent the compressed version of the data, are input into grammar decoder 30. Grammar decoder 30 transforms this string of bits back into grammar comprising variables and ASCII characters. Synthesis engine 35 then transforms the grammar into ASCII data. As this represents a lossless data compression algorithm, the ASCII data output from synthesis engine 35 of data decompressor 25 matches exactly the data input into grammar transform 15 of data compressor 10 shown in FIG. 1. In addition, data decompressor 25 contains all the information of data compressor 10, that is, what each variable in the grammar represents. As with data compression, data decompression is accomplished in a two step process where a construction of a grammar representation is an intermediate step between a string of compressed bits and a string of ASCII data as described in more detail below.

As is clear from the description of the YK encoder set forth in the Background section above, a parsing operation is a basic step in the overall algorithm. The parsing operation essentially tries to obtain the longest possible prefix in the remaining data sequence that can be represented using one of the variables in the current grammar. If possible, the parsed phrase is this variable, otherwise the parsed phrase is the first symbol from the remaining data sequence. The simplest brute force method of performing the parsing operation is to store the A-string represented by each variable and use the remaining data sequence to check the longest match by comparing it with the A-string corresponding to each of the variables in the current grammar. This brute force technique can be improved by performing the search on smaller groups of variables that are grouped according to the first two symbols in their respective A-strings, as described in the second Yang publication cited above. A hashing function implementation of the parsing operation has also been suggested in the second Yang publication.

An improved YK algorithm according to an embodiment of the present invention employed in compressor 10 and decompressor 25 invention described above includes a very fast implementation of the parsing operation using a trie-type data structure. A basic trie-type data structure is described in a publication by D. E. Knuth, *The Art of Computer Programming*. Vol. 2, *Sorting and Searching*. Addison Wesley, Reading, Mass., 1973. This data structure will be referred to as the parsing trie data structure. Also, trie data structures have been applied for lossless data compression algorithms such as Lempel-Ziv algorithms, as described in a publication by T. Bell, I. H. Witten, and J. G. Cleary entitled "Modeling for text compression," *ACM Computing Surveys*, Vol. 21, pp. 557–591, 1989. The entire contents of each of these publications are incorporated by reference herein. As will now be described, an embodiment of the present invention uses the YK algorithm in combination with a parsing trie.

The parsing trie data structure stores the A-strings corresponding to each of the variables as paths originating at a common root. The branches in such a path represent a symbol from A. A node at the end of a path that represents a complete A-string corresponding to a variable, say $s_i$, stores this variable. Such nodes will be referred to as complete nodes. The term "traversal" represents traveling from the root of the parsing trie to one of the branches. Using this data structure, the parsing operation proceeds by using the remaining data string to traverse a path on the data structure.

Whenever a complete node is reached during the traversal, the parsing operation stores the length of the parse and the variable corresponding to the node. The traversal eventually stops either when the end of a path in the data structure is reached, or when a node is reached from which a branch corresponding to the next symbol in the remaining data sequence does not begin. After the traversal stops, the last stored node represents the parsed phrase. If the traversal does not reach any complete node, the first symbol from the remaining data sequence is the parsed phrase.

Figure 3:
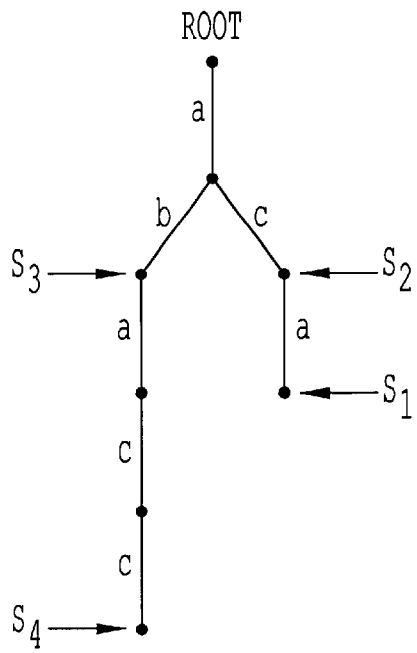
FIG. 3 illustrates an example of a parsing trie data structure for the grammar according to the principles of the present invention.

FIG. 3 illustrates an example of a parsing trie data structure corresponding to irreducible grammar representing the data sequence abacaacabbacbabaccabaccc discussed in the Background section above. Each node stores the quadruplet $\{\pi, \psi, \beta, \sigma\}$, where $\pi$ is a pointer to the parent of the node, $\psi$ is an array of pointers to its children, $\beta \in A$ is the symbol represented by the branch from the node to its parent, and $\sigma \in S \cup \{\phi\}$, $\phi \notin S \cup A$ is the variable represented by the node. Complete nodes have the variable field set to an element of S, while the other nodes have the variable field set to the null symbol $\phi$. As an example of the use of this data structure for parsing, using the parsing trie in FIG. 3 for parsing the remaining data sequence abbbcc . . . is the variable $s_3$. Similarly, if the remaining data sequence is aabbb . . . , then the next parsed phrase is the symbol a.

Figure 4:
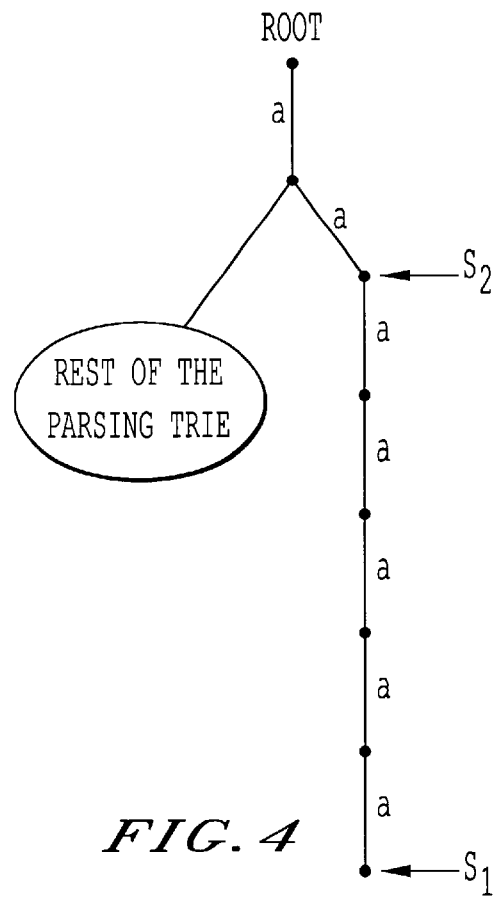
FIG. 4 illustrates an example of how overhead can exist in a parsing trie data structure for the grammar according to the principles of the present invention.

The search for a parsed phrase essentially requires traversal down a path of the parsing trie of length equal to the length of the parsed phrase. In certain cases, there can be an overhead of the traversal continuing past the correct node representing the parsed phrase, until the traversal stops because a branch corresponding to the next symbol in the remaining data is absent. The parsing trie shown in FIG. 4 demonstrates such a case, specifically, an example of overhead in parsing. That is, if the data sequence to be parsed is aaaaaab . . . , the next parsed phrase is the variable $s_2$ in the parsing trie. However, as can be appreciated from FIG. 4, the parsing operation has to traverse all the way up to the node given by the variable $s_1$ before determining the correct parsed phrase. In practical situations, this type of scenario rarely arise, and this overhead when averaged over the course of the YK algorithm is small, as tabulated in Table 1 below for a few data files:

TABLE 1

Overhead Incurred in Parsing Using the Parsing Trie Data Structure

| File Name | File Size | Compression Ratio | Times Parsed | Total Parsing Overhead | Overhead per Parsing |
|---|---|---|---|---|---|
| HTTP6 | 1440 | 2.40 | 321 | 671 | 0.465 |
| HTTP_THREAD | 25488 | 2.72 | 9130 | 12879 | 0.505 |
| ABCNEWS1 | 12947 | 3.43 | 4625 | 5361 | 0.414 |
| TEXTFILE | 90241 | 7.03 | 13331 | 28046 | 0..311 |

As shown, Table I illustrates an example of the overhead incurred in parsing using the parsing trie data structure. "Times Parsed" shows the total number of phrases parsed, while the "Total Parsing Overhead" shows the total number of extra nodes that the parsing operation visits after passing the correct node representing the parsed phrase. "Overhead per Parsing" is the ratio of the "Total Parsing Overhead" divided by the "File Size".

Figure 5:
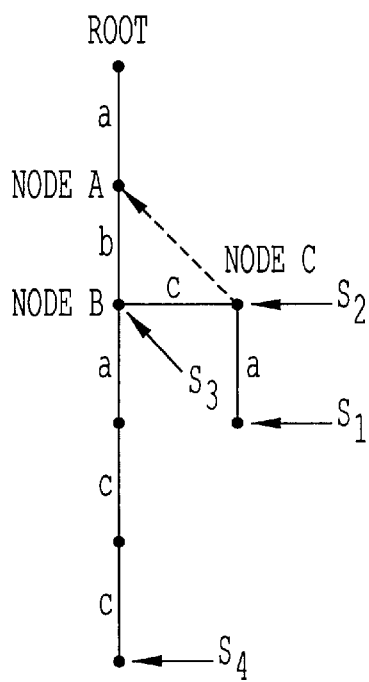
FIG. 5 illustrates an example of a parsing trie data structure for the grammar as shown in FIG. 3 using link lists of sibling nodes according to the principles of the present invention.

As is seen from Table 1, the overhead per parsing is a small fraction of the total size of input data. This shows that the parsing operation is a small fraction more than the data size. Since the number of children for a given node is not known in advance, practical implementations use a single child, which is followed by a linked list of siblings, as shown in the parsing trie of FIG. 5 for the ineducible grammar representing the data sequence abacaacabbacbabaccabaccc discussed in the Background section above. Specifically, FIG. 5 illustrates the parsing trie data structure shown in FIG. 3 implemented using a child and its siblings, rather than multiple children. Node B is the child of Node A, while Node C is the sibling of Node B. The dotted arrow represents that Node A is the parent of Node C. Each node in this implementation stores the quintuplet $\{\pi, \Psi, \omega, \beta, \delta, \}$, where $\pi$, $\beta$ and $\delta$ are as described above, $\Psi$ is a single child rather than an array, and $\omega$ points to the sibling. The use of a linked list of siblings instead of an array of children also leads to an overhead due to the possibility of traversals along the linked lists. However, the benefit of decreased memory usage outweighs this overhead. Moreover, in practical situations, this overhead when averaged over the course of the YK algorithm is negligible too, as tabulated in Table 2 for a few data files:

TABLE 2

Total number of siblings (excluding the direct children) in the parsing trie data structure.

| File Name | File Size | Number of Nodes | Number of Siblings | Siblings to Nodes |
|---|---|---|---|---|
| HTTP6 | 1440 | 404 | 51 | 0.126 |
| HTTP_THREAD | 25488 | 11536 | 729 | 0.063 |
| ABCNEWS1 | 12947 | 4036 | 473 | 0.117 |
| TEXTFILE | 90241 | 21672 | 1345 | 0.062 |

Hence, the parsing operation implemented using this data structure has essentially a linear complexity with data size. In contrast, the brute force method, the grouping method, and the hashing function method do not have linear complexity with data size because for each of these techniques, in general, more than one variable needs to be individually searched for. As a comparison, the second Yang publication reports that the encoder using the grouping method of parsing requires more than three times the time required by the decoder on a file called "index97.ps", while the factor by using the parsing trie data structure is less than 1.5 in the method in accordance with the present embodiment.

In the course of the improved YK algorithm according to an embodiment of the present invention, the parsing trie data structure needs to be updated whenever a new variable $s_i$ is added or the last new variable $s_i$ is modified. A new variable is added under Case 10, and a variable is modified under Case 11, as discussed in the Background section above.

Figure 6:
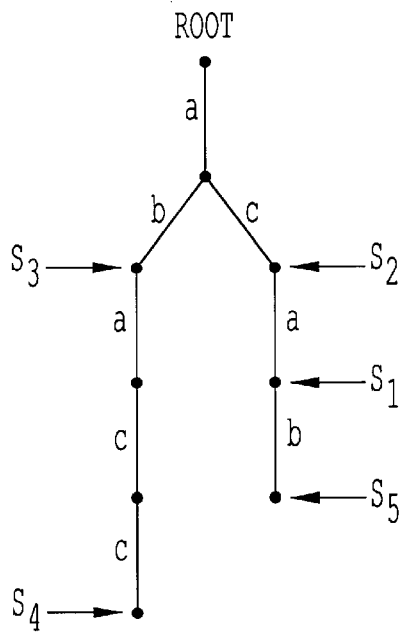
FIG. 6 illustrates an example of updating the parsing trie as shown in FIG. 3 with a new variable efficiently according to the principles of the present invention.

According to Case 10, the updating step is performed by traversing the path corresponding to the A-string represented by the concatenated sequence $\alpha\beta$ as deep into the parsing trie as possible, and then adding the remaining path, if necessary, to the node where the traversal stops as shown in FIG. 6. Specifically, FIG. 6 shows the parsing tree illustrated in FIG. 3 with a new variable $s_5$ given by $s_2 s_3$ being added. The implementation stores the location of each variable in the tree. Hence, whenever · is in S, this traversal can directly start at the node pointed to by ·. The variable for the last node on this path is set to the new variable $s_i$ that is being added. According to Case 11, the updating step is simpler; the path corresponding to the $\beta$ is traversed on the parsing trie starting at the node where the update step in the last iteration of the YK algorithm left off. Note that if $\beta$ is an element of S, then the A-string represented by $\beta$ can be easily determined by starting at the node in the parsing trie represented by $\beta$ reading the symbols of the branch all the way to the root, and then inverting the order of the symbols representing the desired A-string represented by $\beta$. Hence, unlike in the brute force and other parsing techniques, if the parsing trie data structure is used, there is no need to explicitly store the A-strings corresponding to each variable.

This process an be even more simplified if the parsing operation in the current step of the algorithm remembers the location where it started the parting in the input data string and the length of the parse. In this case, the expansion of $\beta$ can easily be obtained by re-reading the input data string from that location for that length. Therefore, there is no need to store the parent node pointers in the implementation of the trie. In this way, memory usage for the trie can be further reduced.

FIG. 6 illustrates an example of updating the parsing trie for Case 10, when both $\alpha$ and $\beta$ are elements of S. Note that as shown in FIG. 6, the addition of a new variable which represents an A-string of length 4 requires the addition of only one extra node in the parsing trie. This example illustrates that the parsing trie data structure is a reasonably compact data structure for storing the A-strings represented by the variables in the grammar.

Error Handling Capabilities of the Improved YK Algorithm

It is noted that when the YK algorithm is used over error-prone communication channels, bit-errors are likely to be introduced into the compressed data stream during transmission. When the communication is over a reliable link, such as a TCP/IP network, the checksum of TCP normally detects this error before the error reaches the decoder. However, there are situations where such a reliable link is not feasible.

For example, many communication terminals perform segmentation and re-assembly of IP datagrams without checking for the correctness of data. The compression and decompression of IP datagrams occur between communication terminals, and there is no explicit error detection until after the decompression step at the receiver terminal. For such applications, the YK decoder should be implemented in such a way that the bit-errors in the compressed data stream do not cause the YK decoder to get into an ambiguous state of operation, which could potentially cause the system to crash. An embodiment of the present invention precisely identifies all the possible erroneous contingencies that can arise, and proposes a way to implement the YK decoder that cleanly comes out of any such contingency.

For example, it can be assumed that A=0,1, . . . , 255), representing the 256 ASCII characters. Also, let $s_j \in S$ be represented as the integer i+255 for j>1. At the $i^{th}$ step of the YK algorithm, let the end-of-sequence symbol $\phi$ used in the arithmetic encoder alphabet for the Case 0 be chosen as $j_i+255$. This is valid, because $j_i+255$ is not an element in $A \cup S^+(j_i)$, and so the decoder can unambiguously recognize the symbol $j_i+255$ at the i th step to be the end-of-sequence symbol. At step i, since the lists $L_1(\gamma)$ are subsets of the lists $L_2(\gamma)$, respectively for $\lambda \Delta A \cup S^+(j_i)$, the two lists are implemented jointly by denoting the elements of the common lists as the quadruple $(\eta, m, n, \rho)$, with $\eta$, m and n as before, and $\rho=1$ if $\eta$ is the first component of one of the elements of $L_1(\gamma)$, and 0 otherwise.

Under Case 10, arithmetic decoding for $\beta$ is performed only if the size of list $L_2(\alpha)$ is bigger than 1; otherwise, $\beta$ is chosen as the only element in the list $L_2(\alpha)$. The arithmetic encoder and decoder are assumed to be implemented in fixed-point along the lines described in the Witten publication referenced above. In particular, both the encoder and decoder maintain a HIGH and a LOW register, and these registers are synchronously shifted whenever bits match on the right side. The decoder maintains a VALUE register, which is formed using the compressed bit-stream The length of these registers can be 16, which is a popular value used in C implementations of an arithmetic encoder. After the encoder codes the end-of-sequence symbol, it needs to send only two more bits from either the HIGH or the LOW register.

With these conventions, the following is an exhaustive list of potentially harmful contingencies that can arise when the decoder operates on an erroneous data stream.

(a) At some step i≧1, the decoder incorrectly decodes I(i) as 1, when the list $L_2(\alpha)$ is in fact empty, and so I(i) should really be 0. The basic YK decoder would then try to access the first entry of the list $L_2(\alpha)$ to determine $\beta$, which would not be possible because the list is empty. This could lead to segmentation faults in the system (b) At some step $i \geq 1$, the decoder incorrectly decodes $I(i)$ as 1, when the list $L_2(\alpha)$ has more than 1 element, but the fourth components of all the elements of this list are 0, and the indicator in the previous step was 0. During arithmetic decoding, the basic YK decoder would run into floating exception, because the cumulative frequencies on an empty alphabet would all be zero.

(c) At some step $i \geq 1$, the decoder incorrectly decodes $I(i)$ as 1, when either the indicator in the previous step was 1, or the list $L_2(\alpha)$ has one element and the indicator in the previous step was 0, and the fourth component of the first element of this list is 0. In this case, the basic YK decoder would expect the first element of the list $L_2(\alpha)$ to be $\beta$. This is inconsistent because no element of the list $L_2(\alpha)$ is also in $L_1(\alpha)$. The decoder would run into an ambiguous while updating the grammar beyond this point.

(d) The decoder never detects the end-of-sequence symbol, and continues to decode the compressed stream without stopping, and could eventually crash the system by exhausting its memory.

These possible errors can be completely avoided by implementing the decoder in such a way that the decoder explicitly checks for these contingencies and force stops any further processing. Force stopping is preferred over having the system crash or having the system enter an infinite loop. The specific steps that need to be included in the decoder to achieve this for each of these four contingencies are as follows:

(a) Each time after the decoder decodes the indicator $I(i)$ as 1, it should explicitly compute the cardinality of the list $L_2(\alpha)$. The decoder must force stop any further processing in case $L_2(\alpha)$ is found empty.

(b) Suppose the decoder decodes the indicator $I(i)$ as 1, the indicator in the previous step was 0, and list $L_2(\alpha)$ is explicitly verified to contain more than one element. The decoder should explicitly search for an element in this list, whose fourth component is one. If such an element is not found, then the decoder must force stop any further processing.

(c) Suppose the decoder decodes the indicator $I(i)$ as 1, and either the indicator in the previous step was 1, or the cardinality of the list $L_2(\alpha)$ is explicitly determined as 1 and the indicator in the previous step was 0. The decoder should explicitly check if the fourth component of the first element in list $L_2(\alpha)$ is 1. If not, the decoder must force stop any further processing.

(d) Suppose the decoder has already read in the last byte in the compressed bit-stream. After that the decoder can arbitrarily choose new bits for the VALUE register, until it can detect the end-of-sequence symbol. However, the maximum number of such arbitrary bits that the decoder needs to choose is (16−2)=14, because the encoder sends two left bits of HIGH or LOW after the end-of-sequence symbol is encoded. Hence, if the compressed bit-stream is error-free, at most 14 more bits need to be added to the right of the VALUE register to finish the decoding. So, to avoid the contingency of never decoding an end-of-sequence symbol, the decoder should keep a count on the number of bits shifted into the VALUE register after the end of the compressed bit-stream. It this count exceeds 14, and the end-of-sequence symbol is not yet decoded, the decoder must force stop any further processing. In some applications, a header is sent to the receiver with the exact size of the original file. In such applications, the decoder has a simpler option. The decoder must stop processing as soon as the number of bytes it has already decoded is one more than the known original file size, without detecting an end-of-sequence symbol.

The above four contingencies will be referred to as contingencies a, b, c, and d respectively, as indicated. After a decoder is designed to take care of these four contingencies, it is still possible that the decoder works on an erroneous compressed stream, and never encounters any of these contingencies. This case will be referred to as the contingency e. For instance, it might detect an end-of-sequence symbol before the end of the compressed bit-stream, and cleanly finish its operation. The decoder does not get into any potentially hazardous situation in this case. The decompressed data would with high probability be incorrect, but a higher layer protocol could be designed to take care of this. Moreover, an erroneous bit-stream does not cause any potential reason to crash the system As an example to verify the performance of such an error-detecting implementation of the YK decoder, an IP datagram called "HTTP6" of size 1440 bytes was compressed using the YK encoder to yield a compressed bit-stream of size 601 bytes. A set of 2000 erroneous bit-streams was constructed from this bit-stream by randomly choosing a bit and flipping it (i.e., intentionally making a "1" bit "0" or vice-versa in one randomly chosen position in the corrected bit stream). The error-detecting implementation of the YK decoder was run on this set, and the YK decoder either finished decoding without any ambiguity, or cleanly stopped any further processing whenever any of the four contingencies above was explicitly detected. Table 3 below reports the numerical distribution of these different contingencies on the set of 2000 files. Note that contingency a (corresponding to empty $L_2(\alpha)$) is the most common:

TABLE 3

Distribution of the contingency types encountered before stopping the decoder on a set of 2000 erroneous compressed bit-streams.

| Contingency Type | Number of Erroneous Bit-Streams |
| --- | --- |
| a | 1514 |
| b | 5 |
| c | 182 |
| d | 173 |
| e | 126 |
| Total Number of Bit-Streams | 2000 |

Memory Constrained Implementation

During YK compression, as the length of the data sequence increases, the grammar also continues to grow in size. Increasing grammar size also implies increasing list sizes, increasing size of the parsing trie data structure, and increasing number of frequency counters. All this translates to increasing memory requirement by the YK algorithm The increasing memory requirement can potentially exceed a limit that can be handled by the hardware and software systems. This can happen either if a large file is being compressed, or if the system is compressing a large number of files simultaneously. In any case, it becomes crucial to design implementations of the YK algorithm whose memory requirement can be explicitly kept in check.

Since the exact memory requirement of the YK algorithm is a random quantity depending on data at hand, the number of variables in the grammar is used as a suitable measure for the memory size of the YK algorithm. This is a meaningful measure because the sizes of the three main data structures used by the YK algorithm, namely, grammar, lists, and parsing trie, are directly influenced by the number of variables. The number of rows in the grammar equals one more than the number of variables, the number of lists equals the sum of the source alphabet size and the number of variables, and the parsing trie data structure stores the A-strings corresponding to each variable.

Two extreme and simple solutions have been suggested in the first Yang publication referenced above. In one approach, the grammar is frozen after a point (referred to as YKF), and only the parsing operation and arithmetic coding continues beyond this point. In another approach, the grammar is periodically restarted from the null grammar (referred to as YKR).

According to an embodiment of the present invention, the memory requirement of the improved YK algorithm remains in check, without taking one of the above extreme steps. This method allows one to choose a limit on the number of variables in advance, and the number of variables is then constrained to lie within this limit. The essential idea is that once the number of variables reaches this limit, the old variables are reused. Hence, no more rows are added to the grammar, while the grammar is still modified. At the same time, no more new lists are created, and the A-string represented by the old variable being replaced is deleted from the parsing trie without affecting any other variables. In addition, the frequency counts $c(\cdot)$ and $\hat{c}(\cdot)$ are also reused. The implementation of the YK algorithm needs to be appropriately modified. The details of the implementation of the memory-constrained YK algorithm with these modifications are presented next.

The memory constrained YK algorithm (YKMC) is described next. In this algorithm, N represents the limit on the number of variables that is set in advance, and · represents the version of a variable S. The countable set of variables S is chosen to be the set $\{(i,\vartheta): 1 \leq i \leq N, \vartheta=1,2,\ldots\}$. In this section, both the elements of S as well as the first components of such elements will be referred to as "variables", and the usage should be clear from the following description. When an old variable $(i,\vartheta)$ is reused, the new variable replacing it is $(i,\vartheta+1)$. The second component of an element of S can be regarded as the Version of the variable. At any given step of the improved YK algorithm, exactly one version of each variable is valid. That is, suppose an old variable $(i,\vartheta)$ is replaced with a new variable $(i,\vartheta+1)$, then the new version of variable i is $\vartheta+1$. The version of each variable at the start of the algorithm is 1. Define a function s: $S \rightarrow \{0,1\}$), which takes the value 1 of a variable if the version of the variable matches the second component of the variable. The valid set of variables at any given step of the algorithm is $s_v=\{(i,\vartheta): s(i,\vartheta)=1\}$.

The memory constrained improved YK algorithm according to an embodiment of the present invention starts and proceeds exactly or essentially exactly like the basic YK algorithm until the number of variables reaches the limit N. Until this step, the version of each of the N variables is 1. After this step, one needs a new-variable function that selects the variable i that is to be replaced whenever required. There exist several intuitive choices for this new-variable function. For instance, a simple choice would be to recycle the variables in the order 1 to N; this function replaces the variables in the increasing order from 1 to N, and the variable chosen after N is 1, and so on. On the other hand, a more sophisticated new-variable function could choose the variable to be replaced as that variable i whose frequency count $c(i)$ is the minimum of all variables at that step.

The indicator function $\iota: \{1,2,\ldots t\} \rightarrow \{0,1\}$ needs to be slightly modified. The indicator function now takes the value 0 not only when there is no reduction possible, but also when reduction is possible and one of the following two cases holds:

1. The parsed phrase $\beta$ is the same as the variable to be replaced, as given by the new-variable function. This is necessary, otherwise the new variable will have itself in its production rule, thus violating admissibility of the new grammar.

2. The indicator in the previous step was 0, and the matching phrase $\alpha\beta$ is located on the row corresponding to the new variable to be replaced. This is necessary, otherwise the irreducibility condition of the new grammar will be violated, because the new variable will appear only once on the right side of the whole grammar.

For all other cases, the indicator function takes the value 1. With respect to this modified indicator function, the three cases are defined exactly as before.

The YKMC algorithm proceeds exactly or essentially exactly like the basic YK algorithm until N variables are created. After that, the YKMC algorithm proceeds according to the following steps:

1. Parsing: The parsing process is exactly as in the YK algorithm, except that the parsing operation is required to choose the parsed phrases from the valid set of variables $S_v$, instead of from S.

2. Grammar Update: Under Case 0 and Case 11, the grammar update is essentially the same as that in the case of the basic YK algorithm. For Case 10, the right side corresponding to the new variable is erased, before new entries are added. Also, for Case 10, the list corresponding to the new variable is erased, before any list updates.

3. Arithmetic Encoding: The arithmetic encoder codes the indicator sequence and the parsed phrases in an interleaved manner as in the YK algorithm The alphabets used for coding the parsed phrases for the three cases is as follows:

Case 0: The alphabet used for coding $\beta$ is $s_v \cup A \cup \{\phi\} - L_2(\alpha)$, except in the following two cases:

1. The variable to be replaced appears as the first components of one of the entries of $L_2(\alpha)$. This is because the decoder does not know in advance if the next parsed phrase $\beta$ is identical to the next variable to be replaced. The alphabet in this case is $(s_v \cup A \cup \{100\} - L_2(\alpha)) \cup \{s\}$ where s is the next variable to be replaced.

2. There exists an entry in the list $L_1(\alpha)$ whose row field is identical to the row corresponding to the next variable to be replaced. This is because the decoder does not know in advance if the phrase $\alpha\beta$ appears in the row corresponding to the next variable to be replaced. The alphabet in this case is $(s_v \cup A \cup \{100\} - L2(\alpha)) \cup \Delta$ where $\Delta$ is the set of those elements of the list $L_2(\alpha)$ whose row field is identical to the row corresponding to the next variable to be replaced.

It is noted that only the valid variables are present in the alphabet.

Case 10: The alphabet used for coding $\beta$ is $L_1(\alpha) \cap (s_v \cup A)$. Note that the list $L_1(\alpha)$ may contain variables that are not valid, hence the alphabet needs to be modified as shown.

Case 11: $\beta$ is not coded as before.

After the YKMC algorithm reaches the end of the input data file, the end-of-sequence symbol $\phi$ is coded as in the YK algorithm Also, as in the YK algorithm, the YKMC decoder decodes the indicator sequence and the parsed phrases using the alphabets above, and updates the grammar and lists exactly like the YKMC encoder.

As the YKMC algorithm progresses, the lists could potentially store a large number of elements that are either not valid symbols or that correspond to outdated matching phrases. Such elements in the lists are not useful any more, and they only serve to increase the sizes of the lists. The YKMC algorithm can keep the list sizes under check by periodically removing such entries.

Figure 7:
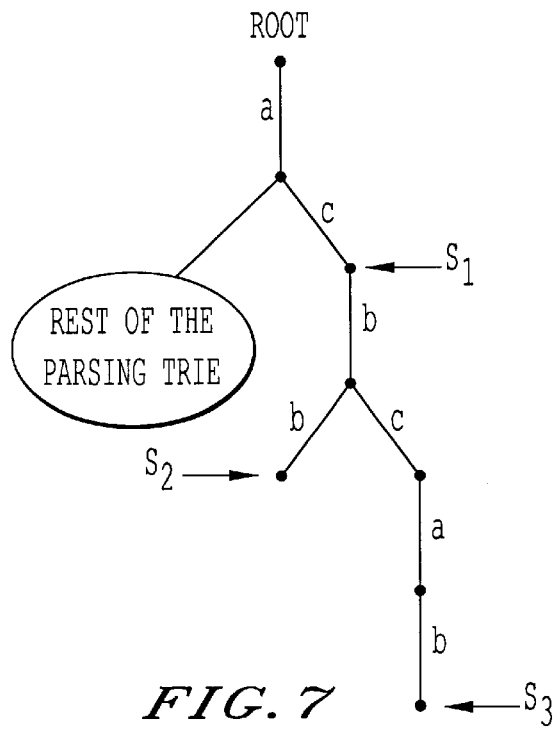
FIG. 7 illustrates a parsing trie for the grammar before a trimming process where an old variable is reused according to the principles of the present invention.
Figure 8:
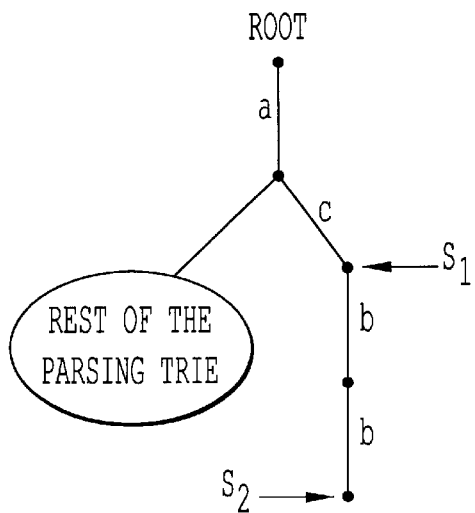
FIG. 8 illustrates the parsing trie of FIG. 7 after one variable has been recycled in the trimming process in order to prevent the parsing trie from becoming excessively too large according to the principles of the present invention.

Similarly, the parse trie data structure also needs to be properly updated whenever a variable is reused. Suppose the parse trie data structure is used for efficiently performing the parsing operation in the YKMC algorithm When a variable $(i,\vartheta)$ is replaced by a new variable $(i,\vartheta 1)$, it is important to remove the A-string corresponding to the old variable $(i,\vartheta)$, without affecting the A-string corresponding to other variables in the parsing trie. This can be performed by starting at the end of the path that represents the old A-string in the parsing trie, and then deleting nodes while moving up the path, until a node is reached that is either complete or has more than one child. FIGS. 7 and 8 demonstrate an example of this trimming process, with FIG. 7 representing a trie before the variable $s_3$ is reused and FIG. 8 representing the trie after the variable $s_3$ is reused. As indicated, the A-string corresponding to this variable is maximally trimmed without affecting other variables in the parsing trie.

Table 4 below lists a few results of using the YKMC algorithm for a few different N on a few files, and compares the performance with the YK, YKF, and YKR algorithms. For these tests, the simple new-variable function that recycles in the order 1 through N is used. It is clear that the YKMC algorithm outperforms YKF and YKR for the same value of N, while the loss in compression efficiency due to YKMC instead of YK is small:

TABLE 4

Compressed files sizes using YKF (Freeze), YKR (Restart), and YKMC (Memory Constrained), using an upper limit of 96 on the number of variables.

| File Name | File Size | YKF | YKR | YKMC |
|---|---|---|---|---|
| HTTP_THREAD | 25488 | 21782 | 17070 | 15375 |
| HTTP1158 | 62917 | 39328 | 27722 | 25928 |
| ABCNEWS1 | 12947 | 7137 | 5820 | 5315 |
| ABCNEWS2 | 32118 | 19049 | 14328 | 12107 |

Using Predefined Source Statistics

The basic implementation of the YK algorithm starts with a flat frequency count distribution on the source alphabet. Symbols in A are initialized with frequency count 1, while variables in s are initialized with frequency count 0. This is the best initialization policy if the source statistics are not known. However, in certain applications, source statistics exhibit a high degree of predictability. In these applications, the frequency counts can be initialized with an estimate of the source statistics. The source statistics get further refined as the compression progresses. This is expected to improve the performance of the YK algorithm, especially while compressing small files. For larger files, the significance of this may be lost, since the YK algorithm has ample opportunity to adapt to the source statistics. Examples of applications where this can be exploited are enumerated below:

Some applications such as IP datagrams that arise in the NNTP port (Port number=119) and the POP3 port (Port number=110), often are dominated by uuencoded data. The characters in such uuencoded portions lie in a limited ASCII range between 33 and 96. This can exploited by initializing the frequency counts of the characters in this range to a high number, while initializing the other characters in $\{0,1, \ldots, 255\}$ to a small number. The first two rows in Table 5 below show the improvements gained on two NNTP datagrams using this differential initialization scheme. The high number is chosen as 20, while the low number is chosen as 1.

Some data are known to come from a limited alphabet. Examples include text data, where the source alphabet is essentially $\{0,1, \ldots, 127\}$. For such files, it is possible to initialize the frequency counts for the ASCII characters in this range to 1, and others to 0. A second example is where the data is known to be binary, and the source alphabet is $\{0,1\}$. As another example, the bottom two rows in Table 5 below show the improvements gained using this initialization on two data strings drawn from the source alphabet $\{0,1,2,3\}$.

TABLE 5

Compressed file sizes using pre-defined source statistics.

| File Name | File Size | YKPS | YK |
|---|---|---|---|
| NNTP_SMALL | 630 | 481 | 493 |
| NNTP | 1440 | 1098 | 1114 |
| FOUR_SMALL | 453 | 104 | 112 |
| FOUR | 5936 | 1227 | 1237 |

Using Predefined Grammar

The basic implementation of the YK algorithm begins with a null grammar. The grammar is built as the algorithm proceeds. The efficiency of the YK algorithm lies in the fact that the grammar that is built during the course of the algorithm implicitly captures the structure of the data, and this leads to the high compression efficiency of the algorithm In certain applications, the essential structure of data changes little from file to file. In such applications, it seems plausible that the grammar in the YK algorithm should be initialized with a pre-defined grammar that models this common structure, instead of initializing with a null grammar. This could be implemented by concatenating a few training files, and running the YK algorithm over them. The resulting grammar and the frequency counts over the source alphabet and the variable set can then be used as a starting point for compression of real files. Instead of building the grammar from scratch as in the original YK algorithm, the present algorithm refines the predefined grammar as the progression proceeds. This approach is expected to yield improvements in compression efficiency, because the YK algorithm does not need to wait to adaptively incorporate the predictable structure of data in its grammar. This approach can be treated as a generalization of invention described in section 9.3.4, because this approach also initializes the source statistics in a non-flat manner.

One example of such an application is the compression of the inroute data of internet servers. The inroute data usually consists of HTTP Requests initiated by a client PC, which have a common template. The first row in Table 6 below shows the comparative results of using this technique against the basic YK algorithm for compressing an HTTP Request. It is clear that the pre-defined grammar approach leads to significant gains:

TABLE 6

Compressed file sizes using pre-defined grammar.

| File Name | File Size | YKPG | YK |
|---|---|---|---|
| HTTP_REQUEST | 227 | 50 | 145 |
| ABCNEWS3 | 22663 | 2507 | 5123 |

Another example of such an application is in the compression of HTML TEXT responses sent by an internet server to its clients. The HTML TEXT responses from an internet server have similarities spanning over several responses. For instance, a news server often has repetitive data on its transmissions on any single day. Moreover, HTML TEXT responses have a lot of standard keywords, that repeat from file to file. The second row in Table 9.9 lists the comparative results of using the pre-defined grammar approach versus the basic null grammar approach for an HTML document. The improvement with the use of pre-defined grammars is evident.

Packet Data Transmission

The YK lossless data compression algorithm can also be employed in a system in which data is transmitted in the form of packets in accordance with the following conditions:

(1) Input data arrives in form of packets one after the other to the YK compressor, (2) The output of the YK compressor needs to be in form of packets, one output packet for each input packet in the same respective temporal order, in such a way that the YK compressor must compress the nth incoming packet and produce the nth output packet without any knowledge of the input packet that arrives after the nth packet.

(3) Output packets from the YK compressor enter the YK decompressor with the temporal order unchanged.

(4) The YK decompressor must decompress the nth compressed packet, and produce a complete and identical copy of the nth input packet without any knowledge of the compressed packets that arrive after the nth compressed packet.

A YK compressor-decompressor algorithm that satisfies the above conditions will now be described and will be referred to as a packetized YK algorithm, and the above four conditions will collectively be referred to as the packetization requirements. If a conventional YK compressor acts on data that arrives in form of packets one after the other, it would have either of the following two choices:

(1) Independent packet approach: The YK compressor would reset itself after processing each packet and before processing the next one, and so each packet would be compressed independently. Using this strategy, the YK algorithm will obviously be able to satisfy the packetization requirements. However, this strategy would be inefficient in terms of compression performance because the YK compressor does not exploit any knowledge of the packets that arrived prior to the current one.

(2) Single datastream approach: The YK compressor would treat the incoming packets as part of a single data stream, ad effectively compress a single file that is a concatenation of the input data packets in the correct temporal order. However, using this strategy, the YK compressor would not satisfy the packetization requirements, since when it reaches the end of the nth packet, it needs to look into the (n+1)th packet in order to finish compressing the nth packet.

In packet-switched communication systems, data is transmitted in form of short packets. The invention disclosed in this document deals with compression of data that gets transmitted in form of short packets using the YK algorithm When consecutive packets are transmitted on the same connection, the compression scheme can often improve the compression efficiency by exploiting the history of the packets that have been transmitted before the current packet. Compression schemes that exploit this history are also referred to as stated compression schemes. However, the compression scheme needs to compress the current packet in full without having to wait for the next packet, and the decompressor must be able to decompress the current compressed packets completely using the history and the current compressed packet. The rationale for these requirements is that there might be an indefinite pause between arrival of successive packets, and the compressor and decompressor can afford an indefinite delay.

Two distinct modifications of the YK algorithm for applicability in a packetized scenario will now be described. One of these two modifications will be more suitable for an application, based on the mechanism by which packets are formed from data for the purpose of transmission. The two distinct mechanisms of packet formation are as follows:

1. The packets originate by breaking down a big file into several short packets. For example, HTTP Text Responses are big and therefore need to be cut into short packets. In this scenario, each packet carries only a small portion of the whole file, and the individual packets are meaningful only when considered as a collection. This will be referred to as packetization at forced boundaries.

2. Each packet exactly corresponds to one meaningful unit of data. For example, HTTP Requests are short messages that can be treated as one packet. This will be referred to as packetization at natural boundaries.

A greedy packetized YK algorithm is first proposed, which is suitable for applications where packetization occurs at forced boundaries. However, the greedy algorithm suffers from performance inefficiencies in applications where packetization occurs at natural boundaries, and a non-greedy packetized YK algorithm which is described in detail below overcomes these inefficiencies.

As discussed in the introduction to packetization scenario above, the independent packet approach while applying the YK algorithm sacrifices significant compression efficiency because it does not exploit the data history. Hence, the independent packet approach will not be described any further.

On the other hand, the main problem with applying the YK algorithm in a single datastream approach is that when the YK algorithm reaches the end of the current packet, it needs to look into the next packet in order to finish the parsing operation. To illustrate this, consider an example, where there are two packets, the first packet being the following data string of length 15 symbols:

abcabcabcabcabc and the second packet being the following data string of length 9 symbols:

abcdefghi

The manner in which a naive application of the YK algorithm proceeds will now be described, assuming that the two packets are treated as part of a single data stream of length 24 symbols that is a concatenation of the individual data strings:

abcabcabcabcabcabcdefghi

After reading in the twelfth symbol from the first packet, the grammar in the YK algorithm looks like:

$s_0 \rightarrow s_2$ $s_1 \rightarrow abc$ $s_2 \rightarrow s_1 s_1$

After this stage, when the YK algorithm performs a parsing operation it reads out the variable: $s_2$. However, this required that the YK algorithm to look beyond the end of the first packet and into the first three symbols of the second packet. This violates the packetization requirements, because then the YK algorithm is not able to complete the compression of the first packet before it looks at the second packet.

Now, the YK algorithm can adopt a strategy to forcibly stop the parsing operation as soon as the packet ends, and produce the result of the sub-optimal parsing. However, a forcible stopping of the parsing operation can lead to two types of problems, which are described in the following:

(1) Continuing with the above example, the YK algorithm would then parse the variable $s_1$. Thereafter, the YK algorithm continues with the second packet. The first variable parsed from the second packet is $s_1$. After this step, the YK algorithm parses the symbol d, and in the updating operations that follow, the YK algorithm incorrectly places the variable $s_1$ in the list $L_1(s_1)$. This has the potential to cause problems later on whenever the variable $s_1$ is parsed twice consecutively, because then the YK algorithm would produce a new variable that would have the production rule as $s_1 s_1$. However, there already is a variable called $s_2$ that stands for this production rule. This creates multiple variables that stand for the same right hand side, and hence leads to sub-optimality. Therefore, the YK algorithm needs to be modified in order to deal with such problems that arise in a packetized scenario.

(2) There is another problem that can arise if parsing is forcibly stopped at packet boundaries. Suppose the YK algorithm finishes one packet by forcibly stopping the parsing operation at the end of the packet, and call the last element in the top row of the grammar after this step as $\alpha$. Thereafter, the YK algorithm proceeds on the next packet. Call the first phrase parsed by the YK algorithm on the next packet as $\beta$. Suppose $\beta \in L_1(\alpha)$, and so the YK algorithm would set the indicator at the current step as 1. However, it could also happen at the same time that the phrase $\alpha\beta$ is already represented by an existing variable in the grammar. This is possible because the YK algorithm had to forcibly stop the parsing operation at the end of the first packet. This scenario is illustrated by the following example: Right after the YK algorithm finishes processing the first packet, suppose $\alpha$ is a, and suppose there are two variables s and s' in the grammar whose production rules are given by:

s→aa and s'→ sa and suppose that $s \in L_1(a)$.

When the YK algorithm starts processing the next packet, suppose the phrase $\beta$ tuns out to be s. In this case, since $s \in L_1(a)$ the YK algorithm would set the indicator at the current step to be 1, and form a new variable s", whose production rule would be given by:

s"→ as

This would be a problem because the two variables s' and s" would then represent identical A—strings.

The above two problems suggest that if a packetized YK algorithm adopts the policy of forcibly stopping the parsing, operation as soon as it is at the end of the current packet, it must adopt a modified strategy when it begins processing the next packet. A packetized YK algorithm should continue to adopt these new strategies in the next packet, until it is assured that it can revert to the usual YK algorithm steps without the possibility of any further problems. After this stage, a packetized YK algorithm would run exactly like a regular YK algorithm, until it reaches the end of the packet where it forcibly stops parsing at the packet boundary, before looking at the next packet.

The above problems suggest that some of the usual rules of the YK algorithm need to be modified after it has finished a packet, and is in the beginning of the next packet. A set of modified rules will now be described for the YK algorithm in the beginning of a new packet.

At the beginning of a new packet, the state is identified as not normal, and as long as the state does not become normal, the modified rules will continue to be used, instead of the usual rules. The index of the last element of the top row of the grammar just before starting a new packet is referred to as ind. When the modified YK algorithm starts processing the new packet, it continues to modify the element sitting at the index ind, until the state becomes normal. When the state becomes normal, the modified YK algorithm adds a new element at the index ind+1, and thereafter the usual rules of YK algorithm hold true for the rest of the packet. The processing finishes when the YK algorithm reaches the end of the packet, and forcibly stops the parsing operation. The same procedure then applies on the next packet i the queue.

The modified rules for the YK algorithm are described next. For reasons that will be discussed later in this section, the modified algorithm will be referred to as the greedy packetized YK algorithm. These modifications pertain only to the grammar and list update steps. Remaining aspects of the modified YK algorithm according to the embodiments of the invention described above, such as parsing, arithmetic encoding and decoding, and frequency updates remain unchanged, with the provision that the parsing operation is forcibly stopped when the end of a packet is reached.

In the following description, the symbol $\alpha$ stands for the element located at the location given by index ind, the symbol $\beta$ is the phrase that is parsed by the YK algorithm in the current step, and the binary variable normal indicates if the state is normal (corresponding to value 1) or not normal (corresponding to value 0).

1. At the beginning of a new packet, normal=0.
2. If normal=0 at the current step of the algorithm, then do the following during this step:

a. If $\beta \in L_2(\alpha)$ and $\beta \notin L_1(\alpha)$, then the indicator at this step will be 0, and the grammar is updated by replacing the symbol at the location ind (which is currently $\alpha$) with the variable s whose production rule is given by:

s→$\alpha\beta$

At the end of the step, no new element would have been added to the top row of the grammar after the location given by ind, and hence for the next step, normal remains 0. No lists are modified in this case.

b. If $\beta \in L_1(\alpha)$, and if the phrase $\alpha\beta$ is represented by an existing variable, then the indicator at this step will be 0, the grammar and lists are updated exactly as in the Case 0 of the usual YK algorithm Note that the symbol at the location ind (which is $\alpha$) remains unmodified in this case. At the end of the step, a new element would have been added at location ind+1, and hence for the next step, normal becomes 1.

c. If $\beta \notin L_2(\alpha)$, then the indicator at the current step is 0, the usual grammar and list updates are applied. At the end of the step, a new element would have been added at location ind+1, and hence for the next step, normal becomes 1.

d. If $\beta \in L_1(\alpha)$, and if the phrase $\alpha\beta$ is not represented by any existing variable, then the indicator at this step will be 1, the grammar is updated like in the usual YK algorithm (appropriately under either Case 10 or 11). Note that the symbol at location ind (which is currently $\alpha$) gets modified in this case. At the end of the step, no new element would have been added at the location ind +1, and hence for the next step, normal remains 0. No lists are modified in this case.

3. If normal=1 at a given step of the algorithm, then apply the usual rules of the YK algorithm at this step, and at the end of this step, normal remains 1.

Note that the rules 2a and 2b described above respectively deal with the two potentially problematic situations identified earlier with the application of YK algorithm in a packetized scenario when the parsing operation is stopped forcibly at the end of the previous packet. In all other situations, the rules 2c and 2d ensure that the modified algorithm works exactly like the usual YK algorithm. This solution is called greedy because even when the state is not normal, the algorithm continues to create or modify new variables under Cases 10 and 11, except when the situation in rule 2b is true.

Application of rule 2a effectively makes the algorithm behave as if it parsed the complete phrase $\alpha\beta$ in the last step. In rule 2b, the algorithm sets the indicator in the current step to be 0, even though there is a candidate match elsewhere in the grammar. This leads to a small sacrifice in compression efficiency because of multiple matching phrases that are created in the grammar. The encoder could have avoided this by clubbing $\alpha$ and $\beta$ together, and putting the variable that represents the complete phrase $\alpha\beta$ at the location ind. The encoder easily checks if there exists a variable that represents the phrase $\alpha\beta$ by simply traversing the trie data structure that it maintains to perform the parsing operation. However, in order for this to be replicated easily at the decoder, the decoder would need to maintain the parsing trie data structure, which would account for a huge amount of extra memory for a relatively small gain in compression efficiency.

The greedy solution can suffer from a drawback in the case where packetization occurs at natural boundaries. This problem will now be illustrated by the following example. Consider the application where HTTP request headers arrive one after the other in a queue, and each HTTP request is treated as one packet. HTTP requests usually begin with the phrase "GET http://" and end with two new-line characters. After the first two such HTTP requests, the greedy algorithm would have created a variable s' whose production is given by:

s'→vGET http:// where v denotes a variable whose production rule consists of two new-line characters.

While processing the third such HTTP request, the greedy algorithm would find the repeated phrase "GET http:/" and it creates a new variable with the production rule:

s"→vGET http:/

And after the next few such HTTP requests, the grammar will have a series of variables whose production rules will look like:

s'''→vGET http:
s' '''→vGET http
s" '''→vGET htt
s''' '''→vGET ht
. . .
. . .
s''' ''' '→vGE
s''' ''' "→vG Note that each of these production rules falls on two sides of a boundary between two typical HTTP requests. These variables do not contribute to the compression efficiency because the phrases matching with these production rules are likely to happen only on the packet boundaries, and hence these phrases would never be parsed since the parsing operation is forced to stop at the end of each packet boundary. Indeed, these variables would only contribute to some sacrifice in performance because they increase the total number of variables in the grammar.

In addition, since a production rule corresponding to the right hand given by "GET http://" never gets created in the process, the repetitiveness of the phrase "GET http://" is not exploited by the greedy algorithm. This tends to give poor compression efficiency in scenarios where packets are created at natural boundaries like in the above example. However, in scenarios where packetization occurs at forced boundaries, no such predictable structure is retained around packet boundaries, and the greedy algorithm tends to perform better in those cases.

To summarize, the greedy algorithm can lead to poor compression efficiency in certain applications where packetization occurs at natural packet boundaries. This happens mainly because of the fact that Rule 2d in the greedy algorithm allows the creation of new variables even when the state is not normal. These variables may eventually be not at all useful, as seen in the example above, and would just add to the size of the set of variables. Moreover, the creation of these variables prevents the creation of some much more useful variables such as one that would have the phrase "GET http://" in its production rule. The Rule 2d is too greedy to create new variables whenever possible, and hence we have referred to the greedy packetized YK algorithm that way.

As discussed above, the greediness embodied in Rule 2d may cause a poor performance of the greedy packetized YK algorithm in scenarios where packetization occurs at natural packet boundaries. Hence, for such scenarios, a non-greedy packetized YK algorithm that essentially removes Rule 2d and replaces Rule 2b with a new Rule 2b' will now be described:

1. At the beginning of a new packet, normal=0.
2. If normal=0 at a given step of the algorithm, then do the following during this step:
   a. If $\beta \in L_2(\alpha)$ and $\beta \notin L_1(\alpha)$, then the indicator at this step will be 0, and the grammar will be updated by replacing the current $\alpha$ with the variable s whose production rule is given by:

s→$\alpha\beta$

At the end of the step, no new element would have been added to the top row of the grammar after the location given by ind, and hence for the next step, normal remains 0. No lists are modified in this case.

b'. If $\beta \in L_1(\alpha)$, then the indicator at this step will be 0, the grammar and fists will be updated exactly as in the Case 0 of the usual YK algorithm. Note that the symbol at location ind (which is $\alpha$) is not modified in this case. At the end of the step, a new element would have been added at location ind+1, and hence for the next step, normal becomes 1.

c. If $\beta \notin L_2(\alpha)$, then the indicator at the current step is 0, the usual grammar and list updates are applied. At the end of the step, a new element would have been added at location ind+1, and hence for the next step, normal becomes 1.
3. If normal=1 at a given step of the algorithm, then apply the usual rules of the YK algorithm at this step, and at the end of this step, normal remains 1.

Hence, the non-greedy algorithm always sets the indicator to be 0, as long as the state does not become normal.

The following Table 7 reports a few test results that show the performance of the greedy and non-greedy algorithms for a few data sets. The first data-set "HTTPREQ" is a sequence of HTTP requests, where each HTTP request corresponds to one packet (packetization at natural boundaries). The packet size varies from packet to packet, with each packet size typically between 100 and 500 bytes. The next two data sets "PHILLYREST" and "TESTFILE" are two large files that are broken up into packets of fixed size 400 bytes each (except the last packet in each case, which have less than 400 bytes because the files are not multiples of 400, packetization at forced boundaries). Table 7 also illustrates the ideal (non-packetized) compression performance using the usual YK algorithm when the YK algorithm acts on the complete set of packets at once, that is, the YK algorithm acts on the file formed by concatenating the packets. This Table this illustrates how much compression is sacrificed because of the packetization requirement.

TABLE 7

Example of Performance of Greedy and Non-Greedy Algorithms

| Filename | Original Size | Greedy YK Size | Greedy YK Comp Ratio | Non-greedy YK Size | Non-greedy YK Comp Ratio | Ideal YK Size | Ideal YK Comp Ratio |
|---|---|---|---|---|---|---|---|
| HTTPREQ | 116563 | 9167 | 12.72 | 7635 | 15.27 | 7031 | 16.58 |
| PHILLYREST | 72823 | 21106 | 3.45 | 21156 | 3.44 | 20175 | 3.61 |
| TESTFILE | 183797 | 28788 | 6.39 | 28878 | 6.37 | 26228 | 7.01 |

As Table 7 demonstrates, the greedy algorithm gives a poor performance for HTTPREQ, which is what we expected because the packets in HTTPREQ are created at natural packet boundaries. The improvement in compression efficiency using the non-greedy algorithm is significant in this case (15.27 in place 12.72, which stands for 16.70% improvement). The greedy algorithm performs slightly better than the non-greedy algorithm for the other two data sets, where packetization occurs at forced boundaries. The improvement using the greedy algorithm is small (3.45 in place of 3.44, and 6.39 in place of 6.37, roughly 0.30% improvement each).

The following describes why the greedy algorithm does not perform much better than the non-greedy algorithm in scenarios where packetization occurs at forced boundaries. The reason for the performance loss using the non-greedy algorithm is that the non-greedy algorithm does not create a new variable when a new packet is not yet normal even if it finds a matching phrase there, while the greedy algorithm creates a new variable in this situation. The new variable that could have been created in this situation is useful in the future, only if the phrase represented by it recurs several times in the future. However, since the packetization happens at forced boundaries, the new instances of this phrase would most likely not fall at packet boundaries, but would fall in the body of some packet in the future. The non-greedy algorithm would then create the new variable at the next occurrence of the phrase, and thereafter it will also exploit the frequent recurrence of the phrase. So, the non-greedy algorithm makes up for its inability to create the new variable very soon, and only a small loss in compression efficiency results owing to the fact that the non-greedy algorithm exploited one less instance of the repetition of the phrase than the greedy algorithm.

Comparing the results of the non-greedy packetized YK algorithm against that of the ideal YK algorithm shows that the performance of the non-greedy algorithm is close to that of the ideal YK algorithm. In other words, the performance loss due to the packetization requirement is small.

To summarize the above packetized scenarios:
  1. In situations where only natural packetization occurs, the non-greedy packetized YK algorithm must be used.
  2. In situations where packetization occurs only at forced boundaries, the greedy packetized YK algorithm must be used.
  3. In situations where both types of packetization—natural and forced—are expected to occur, then the ideal choice is non-greedy algorithm In summary, the embodiments of the present invention described herein provide new modifications to the conventional YK algorithm that meets the packetization requirements while at the same time exploits the past history of packets that have arrived before the current packet, in order to achieve high compression efficiency, unlike the independent packet approach described above. The embodiments are particularly useful for the HTTP PEP product line of DirecPC and VSAT. In the VSAT product specifically, HTTP Requests are piped into a queue, and stated compression of these packets in the queue is allowed. Also, this product plans to transmit HTML web pages by breaking them into packets, As can be appreciated from the above descriptions, the embodiments of the invention provide a system and method employing an improved YK algorithm which uses an appropriate form of the trie data structure for the parsing operation. With the use of this data structure, the parsing complexity using this data structure is essentially proportional to the data size, and hence is very fast. The improved YK algorithm also is capable of handling errors in data without getting into an ambiguous state or causing the hardware or software system to crash. The improved YK algorithm also sequentially updates the grammar, while keeping the number of variables below a pre-defined limit. This changes the grammar gradually, and can potentially increase the compression efficiency.

The improved YK algorithm is also capable of starting with a pre-defined frequency distribution at both the encoder and the decoder, in order to improve the compression efficiency. The algorithm can bias the frequency distribution on the original source alphabet using advance knowledge of the source statistics at both the encoder and the decoder. This is particularly useful on small data sizes, such as IP frames, where the data sizes are not sufficient for the YK encoder to adaptively estimate an accurate frequency distribution. The improved YK algorithm also can take advantage of an already pre-defined grammar at the start of the YK algorithm to compress as well as decompress data. This can significantly improve the compression efficiency in applications where data files share a similar structure, and hence a pre-defined grammar built using training files that have the same structure is a good model for the data set to be compressed. Since the YK algorithm is a sequential algorithm in nature, this is essentially equivalent to running the YK algorithm over the training data concatenated with the data to be compressed, and starting the arithmetic encoding only at the end of the training data portion of the total data. Pre-defined source statistics becomes a special case of this invention because a pre-defined grammar also stores a pre-defined frequency count distribution on the symbols and already existing variables in the pre-defined grammar.

The embodiments of the present invention described above are applicable to essentially any type of communications system requiring data compression and decompression. The fast parsing operation would lead to fast implementation. Also, for this application, using pre-defined source statistics can lead to further compression efficiency. This is especially true for datagrams originating at the NNTP port (Port Number=119), which are dominated by uuencoded data, and hence show a very characteristic statistical bias. The memory restrained implementation is important when there are several compression processes running on parallel TCP threads, for instance in the compression of Turbo-Internet IP datagrams. Another application where memory restrained implementation would be useful is for stated Turbo-internet compression, where the data can grow to large sizes. For broadcast applications such as WebCast and NewsCast, where the data in individual channels have a lot of predictable structure, using pre-defined grammar built using typical data from respective channels can lead to further improvement. Another application of pre-defined grammar is in stated compression of internet datagrams in a single TCP connection thread. The successive datagrams in a TCP thread exhibit strong resemblance, and pre-defined grammars would lead to further improvement.

The embodiment of the present invention described above are also applicable to VSAT/PES products such as HTTP PEP. The inroute of HTTP PEP is highly compressible using the YK algorithm, but the data sizes can be large. Here the memory constrained implementation can be useful. In addition to the speed and memory restrained implementation, the capability of the decoder to handle bit-errors, when used for link-layer compression between two communication terminals, where segmentation and re-assembly (SAR) of IP packets is done without verifying the accuracy of received data, can prove advantageous.

While the preferred embodiments have been set forth with a degree of particularity, it is to be understood that changes and modifications could be made to the construction thereof which would still fall within the teachings of the claimed invention as set forth in the following claims.

What is claimed is:

1. A data compression method, comprising:
parsing an input string into irreducible grammar using a trie-type data structure that represents variables of the irreducible grammar;
updating said variables of said irreducible grammar based on at least one character to be parsed in the input string; and
encoding said irreducible grammar into a string of bits.

2. A method according to claim 1, wherein:
said trie-type data structure comprises a root and a plurality of nodes, and traversal of said trie-type data structure from said root to one of said plurality of said nodes achieves a representation of variables of said grammar.

3. A method according to claim 2, wherein each node comprises:
an up branch value;
a parent node;
at least one child node; and
a variable that represents said node.

4. A method according to claim 2, wherein:
one node is a sibling of another node.

5. A method for performing data decompression on an input bit stream being received by a decoding system, comprising:

decoding said input bit stream based on irreducible grammar; and
updating said irreducible grammar based on at least one character to be parsed in the input string;
said decoding and updating steps being performed to substantially prevent any bit-error in said input bit stream from adversely affecting operation of said decoding system.

6. A method according to claim 5, wherein:
said decoding step includes further using said updated grammar to decode said input bit stream.

7. A method according to claim 5, further comprising:
ceasing decoding said input bit stream when a value register in said decoding system contains more than a predetermined number of bits indicating that the end of said input data stream was not received by said decoder.

8. A data compression method, comprising:
parsing an input string into irreducible grammar;
updating the grammar based on a character to be parsed in the input string;
encoding said irreducible grammar into a string of bits;
repeating said parsing, updating and arithmetically encoding steps until a number of variables for said grammar reaches a predetermined limit; and
reusing a previous variable by deleting said previous variable from said grammar and creating a new variable that is defined by additional input data to prevent said grammar from exceeding a predetermined limit of memory.

9. A data compression method as claimed in claim 8, wherein:
said parsing step parses said input string based on a trie-type data structure representing variables of said irreducible grammar; and
said data compression method further comprises optimally trimming said trie-type data structure when one of said variables is reused.

10. A data compression method, comprising:
parsing an input string into irreducible grammar based on a pre-defined frequency count distribution of a source alphabet;
updating the grammar based on at least one character to be parsed in the input string; and
encoding said irreducible grammar into a stream of bits.

11. A method according to claim 10, further comprising:
determining said predefined frequency distribution based on training files.

12. A method according to claim 10, further comprising:
representing variables of said irreducible grammar in a trie-type data structure; and
said parsing step includes parsing said input string into said irreducible grammar further based on said variables.

13. A data compression method, comprising:
parsing an input string into irreducible grammar based on pre-defined grammar;
updating the grammar based on the last character to be parsed in the input string; and
encoding said irreducible grammar into a stream of bits.

14. A method according to claim 13, further comprising:
creating said pre-defined grammar based on training files.

15. A method according to claim 13, further comprising:
creating said pre-defined grammar including a predefined frequency distribution of a source alphabet.

16. A method according to claim 13, further comprising:
representing variables of said irreducible grammar in a trie-type data structure; and
said parsing step includes parsing said input string into said irreducible grammar further based on said variables.

17. A method for compressing a data bit stream configured in the form of data packets, comprising:
parsing the bits in a data packet into irreducible grammar based on a trie-type data structure that represents variables of said irreducible grammar;
updating said irreducible grammar based on at least one character to be parsed in said data packet; and
encoding said irreducible grammar into a decoded data packet including data bits.

18. A method according to claim 17, further comprising:
optimally configuring the grammar updating step for the data packets which are formed by dividing larger groups of data in the data bit stream into the data packets; and
wherein said updating step refrains from updating said irreducible grammar based on bits in said data bit stream subsequent to said data packet being parsed.

19. A method according to claim 17, wherein:
said data bit stream includes natural boundaries forming boundaries of said data packet; and
said updating step refrains from updating said irreducible grammar based on bits in said data bit stream subsequent to said data packet being parsed.

20. A computer readable medium of instructions for controlling a data compressor to compress data, comprising:
a first set of instructions, adapted to control said data compressor to parse an input string into irreducible grammar using a trie-type data structure that represents variables of the irreducible grammar;
a second set of instructions, adapted to control said data compressor to update said variables of said irreducible grammar based on at least one character to be parsed in the input string; and
a third set of instructions, adapted to control said data compressor to encode said irreducible grammar into a string of bits.

21. A computer readable medium of instructions according to claim 20, further comprising:
a fourth set of instructions, adapted to control said data compressor to generate said trie-type data structure which comprises a root and a plurality of nodes, such that traversal of said trie-type data structure from said root to one of said plurality of said nodes achieves a representation of variables of said grammar.

22. A computer readable medium of instructions according to claim 21, wherein each node comprises:
an up branch value;
a parent node;
at least one child node; and
a variable that represents said node.

23. A computer readable medium of instructions according to claim 21, wherein:
one node is a sibling of another node.

24. A computer readable medium of instructions for controlling a decoding system to perform data decompression on an input bit stream being received by a decoding system, comprising:
a first set of instructions, adapted to control said decoding system to decode said input bit stream based on irreducible grammar; and
a second set of instructions, adapted to control said decoding system to update said irreducible grammar based on at least one character to be parsed in the input string;
said first and second sets of data being further adapted to control said decoding system to perform said decoding and updating to substantially prevent any bit-error in said input bit stream from adversely affecting operation of said decoding system.

25. A computer readable medium of instructions according to claim 24, wherein:
said second set of instructions is further adapted to control said decoding system to use said updated grammar to decode said input bit stream.

26. A computer readable medium of instructions according to claim 24, further comprising:
a third set of instructions, adapted to control said decoding system to cease decoding said input bit stream when a value register in said decoding system contains more than a predetermined number of bits indicating that the end of said input data stream was not received by said decoding system.

27. A computer readable medium of instructions for controlling a data compressor to compress data, comprising:
a first set of instructions, adapted to control said data compressor to parse an input string into irreducible grammar;
a second set of instructions, adapted to control said data compressor to update said grammar based on a character to be parsed in the input string;
a third set of instructions, adapted to control said data compressor to encode said irreducible grammar into a string of bits;
a fourth set of instructions, adapted to control said data compressor to repeat said parsing, updating and arithmetically encoding operations until a number of variables for said grammar reaches a predetermined limit; and
a fifth set of instructions, adapted to control said data compressor to reuse a previous variable by deleting said previous variable from said grammar and creating a new variable that is defined by additional input data to prevent said grammar from exceeding a predetermined limit of memory.

28. A computer readable medium of instructions as claimed in claim 27, wherein:
said first set of instructions is further adapted to control said data compressor to parse said input string based on a trie-type data structure representing variables of said irreducible grammar; and
said computer readable medium of instructions further comprises a sixth set of instructions, adapted to control said data compressor to optimally trim said trie-type data structure when one of said variables is reused.

29. A computer readable medium of instructions for controlling a data compressor to compress data, comprising:
a first set of instructions, adapted to control said data compressor to parse an input string into irreducible grammar based on a predefined frequency count distribution of a source alphabet;
a second set of instructions, adapted to control said data compressor to update said grammar based on at least one character to be parsed in the input string; and
a third set of instructions, adapted to control said data compressor to encode said irreducible grammar into a stream of bits.

30. A computer readable medium of instructions according to claim 29, further comprising:

a fourth set of instructions, adapted to control said data compressor to determine said predefined frequency distribution based on training files.

31. A computer readable medium of instructions according to claim 30, further comprising:

a fifth set of instructions, adapted to control said data compressor to represent variables of said irreducible grammar in a trie-type data structure; and said first set of instructions is further adapted to control said data compressor to parse said input string into said irreducible grammar further based on said variables.

32. A computer readable medium of instructions for controlling a data compressor to compress data, comprising:

a first set of instructions, adapted to control said data compressor to parse an input string into irreducible grammar based on pre-defined grammar;

a second set of instructions, adapted to control said data compressor to update the grammar based on the last character to be parsed in the input string; and a third set of instructions, adapted to control said data compressor to encode said irreducible grammar into a stream of bits.

33. A compute readable medium of instructions according to claim 32, further comprising:

a fourth set of instructions, adapted to control said data compressor to create said pre-defined grammar based on training files.

34. A computer readable medium of instructions according to claim 32, further comprising:

a fifth set of instructions, adapted to control said data compressor to create said pre-defined grammar including a predefined frequency distribution of a source alphabet.

35. A computer readable medium of instructions according to claim 32, further comprising:

a sixth set of instructions, adapted to control said data compressor to represent variables of said irreducible grammar in a trie-type data structure; and said first set of instructions is further adapted to control said data compressor to parse said input string into said irreducible grammar further based on said variables.

36. A computer readable medium of instructions for controlling a data compressor to compress a data bit stream configured in the form of data packets, comprising:

a first set of instructions, adapted to control said data compressor to parse the bits in a data packet into irreducible grammar based on a trie-type data structure that represents variables of said irreducible grammar;

a second set of instructions, adapted to control said data compressor to update said irreducible grammar based on at least one character to be parsed in said data packet; and a third set of instructions, adapted to control said data compressor to encode said irreducible grammar into a decoded data packet including data bits.

37. A computer readable medium of instructions according to claim 36, wherein:

said second set of instructions is adapted to optimally configure the grammar updating for the data packets which are formed by dividing larger groups of data in the data bit stream into the data packets, and is further adapted to control said data compressor to refrain from updating said irreducible grammar based on bits in said data bit stream subsequent to said data packet being parsed.

38. A computer readable medium of instructions according to claim 36, wherein:

said data bit stream includes natural boundaries forming boundaries of said data packet; and said second set of instructions is further adapted to control said data compressor to refrain from updating said irreducible grammar based on bits in said data bit stream subsequent to said data packet being parsed.

* * * * *